(12) United States Patent
Park et al.

(10) Patent No.: US 7,799,605 B2
(45) Date of Patent: Sep. 21, 2010

(54) INTEGRATED CIRCUIT MODULE AND METHOD OF FORMING THE SAME

(75) Inventors: Sung-Joo Park, Anyang-si (KR); Kyoung-Sun Kim, Euijeongbu-si (KR); Jung-Joon Lee, Seoul (KR); Jea-Eun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 538 days.

(21) Appl. No.: 11/878,697

(22) Filed: Jul. 26, 2007

(65) Prior Publication Data

US 2008/0023702 A1   Jan. 31, 2008

(30) Foreign Application Priority Data

Jul. 31, 2006   (KR) .................. 10-2006-0071895

(51) Int. Cl.
*H01L 21/44* (2006.01)
*H01L 23/48* (2006.01)

(52) U.S. Cl. .................. 438/107; 438/108; 438/118; 438/612; 257/690; 257/773

(58) Field of Classification Search .................. 438/107, 438/108, 109, 118, 121, 125, 612, 666, 667; 257/690, 691, 692, 773, 778, 786
See application file for complete search history.

(56) References Cited

U.S. PATENT DOCUMENTS

| | | | |
|---|---|---|---|
| 6,294,407 B1* | 9/2001 | Jacobs ..................... 438/118 |
| 7,123,465 B2* | 10/2006 | Crane et al. ................. 438/386 |
| 2003/0047348 A1* | 3/2003 | Jessep et al. ................. 257/786 |
| 2003/0146510 A1* | 8/2003 | Chien ........................ 438/613 |
| 2006/0033187 A1* | 2/2006 | Wilder et al. ............... 257/668 |

* cited by examiner

*Primary Examiner*—Kevin M Picardat
(74) *Attorney, Agent, or Firm*—Harness, Dickey & Pierce, P.L.C.

(57) ABSTRACT

A method of forming an integrated circuit module may include interposing an auxiliary PCB between at least one semiconductor chip and a main PCB, the auxiliary PCB having at least one circuit pattern for electrical connection to one of the semiconductor chip and at least one circuit pattern formed on the main PCB.

19 Claims, 8 Drawing Sheets

US 7,799,605 B2

INTEGRATED CIRCUIT MODULE AND METHOD OF FORMING THE SAME

PRIORITY STATEMENT

This U.S. non-provisional patent application claims benefit of priority under 35 U.S.C. §119 of Korean Patent Application 10-2006-0071895, filed on Jul. 31, 2006, in the Korean Intellectual Property Office (KIPO), the entire contents of which is hereby incorporated by reference.

BACKGROUND

1. Field

Example embodiments relate to integrated circuit modules, for example, an integrated circuit module and method of forming the same.

2. Description of Related Art

Electronic instruments are becoming increasingly complicated in structure and more multi-functioned. As a result, the capacitance of integrated circuits including memory devices used in these electronic instruments may be increasing. Thus, the electrical instruments may tend to use a plurality of semiconductor memory devices as units of a memory module or integrated circuit module, rather than using individual semiconductor memory devices. The memory module or integrated circuit module may allow a plurality of semiconductor memory devices to be mounted on one printed circuit board (PCB).

FIG. 1 illustrates a conventional integrated circuit module.

Referring to FIG. 1, a conventional integrated circuit module 10 includes one or more semiconductor chips and a PCB 12.

The one or more semiconductor chips 14 may be structured in a ball grid array package (hereinafter, referred to as 'BGA package'). The BGA package was developed in response to a requirement for more input/output pins and more efficient heat discharge due to an increased integration of semiconductor devices. A BGA package includes a plurality of external connection terminals, used as input/output pins, which are formed as an array on a face of the BGA package. A BGA package reduces the amount of mounting area required for the semiconductor chips and has a prominent heat resistance and electrical characteristic.

Though not shown in the drawing, a BGA package includes a semiconductor chip 14 having input/output pads and solder pads connected to the input/output pads. Solder balls may be attached to each of the solder pads.

A PCB 12 has a space for where at least one semiconductor chip 14 is mounted, and a circuit pattern is formed and connected to the at least one semiconductor chip. The PCB 12 also has a space for where a decoupling device is installed, and a circuit pattern is formed connected to the decoupling device. Further, the PCB has a space for where a circuit pattern interfaced with another PCB is formed.

In the PCB 12, solder pads to be connected to input/output pads of the semiconductor chip are installed at corresponding positions. The solder pads are electrically connected to the circuit patterns.

The semiconductor chip 14 is mounted on the PCB 12 by attaching the solder balls of the semiconductor chip 14 to the solder pads of the PCB 12. For example, the solder balls are heated above a melting point and attached to the solder pads of the PCB 12. The solder balls are formed of a conductive material, thus electrically connecting the semiconductor chip 14 and the PCB 12.

FIG. 2 is a plan view of a conventional PCB included in a conventional integrated circuit module. FIG. 2 schematically illustrates a mounted portion 20 of a PCB 12 where one semiconductor chip 14 may be mounted.

Referring to FIG. 2, solder pads 22 are disposed on the PCB 12 at positions corresponding to each of the solder balls or solder pads of the semiconductor chip 14. The solder pads 22 are coupled with circuit patterns 28, which may be coupled with other solder pads 22 in the mounted portion 20 of the PCB 12 or with via holes 24 that may be provided through the PCB 12. The via holes 24 may electrically connect the circuit patterns 28 with solder pads (not shown) formed on a face opposite to the mounted portion 20 of the PCB 12. For example, the via holes 24 may electrically connect symmetrical semiconductor chips mounted on opposite faces of the PCB. The circuit patterns 28 may be designed and disposed, corresponding to an operating characteristic of a mounted semiconductor chip 14.

A test pad 26 for a test or operation measurement is formed outside of the mounted portion 20 of the PCB 12. The test pad 26 is used to perform a test after mounting the semiconductor chip 14 on the PCB 12. A plurality of test pads 26 may be provided corresponding to the number of pads required for the test.

Problems in the wiring of the circuit patterns become more serious as a result of larger capacity and higher integration of an integrated circuit module. Even in an integrated circuit module in which wiring has been completed, a test signal line to evaluate a characteristic of the module, for example, to measure fidelity of the signals, may need to be added. However, solder pads 22 of an array type similar to that shown in FIG. 2 and/or input/output pads may be crowded, thus making it difficult to add a signal line or circuit pattern.

SUMMARY

Example embodiments may provide an integrated circuit module, and a method of forming the same, in which a signal line or circuit pattern may be added without increasing a mounting area or mounting height, thus increasing wiring efficiency.

Example embodiments may provide an integrated circuit module, and a method of forming the same, that may reduce an area of PCB on which semiconductor chips are mounted, thus increasing layout efficiency.

Example embodiments may provide an integrated circuit module, and a method of forming the same, that may reduce a difference between a signal actually input to a device and a measurement signal, thus lessening a distortion for signal fidelity and degradation.

Example embodiments may provide an integrated circuit module that may enhancing the reliability of the wiring.

In an example embodiment, a method of forming an integrated circuit module may include interposing an auxiliary PCB between at least one semiconductor chip and a main PCB, the auxiliary PCB having at least one circuit pattern for electrical connection to one of the semiconductor chip and at least one circuit pattern formed on the main PCB.

According to an example embodiment, the semiconductor chip may be a BGA package.

According to an example embodiment, the semiconductor chip may include a plurality of first pads arranged in an array on a face of the semiconductor chip and the main PCB may include a plurality of second pads corresponding to the plurality of first pads. The method may further include aligning the plurality of first pads of the semiconductor chip with the plurality of second pads of the main PCB through a corresponding plurality of holes formed in the auxiliary PCB.

According to an example embodiment, the method may further include forming a conductive bump on at least one of the first pads of the semiconductor chip; filling a corresponding one of the holes of the auxiliary PCB with the conductive bump to electrically connect the conductive bump to a corresponding one of the second pads of the main PCB; and performing a reflow process on the conductive bump to form a conductive joint electrically connecting the first pad and the second pad corresponding to the hole filled by the conductive bump.

According to an example embodiment, the auxiliary PCB may have a thickness less than or equal to a height of the conductive bump.

According to an example embodiment, the circuit pattern of the auxiliary PCB may extend to an edge of one of the holes formed in the auxiliary PCB, and the performing the reflow process forms a conductive joint that electrically connects to the circuit pattern of the auxiliary PCB.

According to an example embodiment, the auxiliary PCB may include at least one input/output pads connected to the edge portion of at least one of the plurality of holes, and the performing the reflow process forms a conductive joint that electrically connects to the input/output pad.

According to an example embodiment, the circuit pattern may be connected to one of a test pad and a decoupling device.

According to an example embodiment, the auxiliary PCB may be a flexible single layer substrate.

According to an example embodiment, the auxiliary PCB may be a multilayer structure including a plurality of flexible substrate layers.

In an example embodiment, an integrated circuit module may include a main printed circuit board (PCB) having at least one mounting region and at least one circuit pattern; at least one semiconductor chip disposed on the mounting region; and an auxiliary PCB interposed between the semiconductor chip and the main PCB, the auxiliary PCB having at least one circuit pattern electrically connected to at least one of the semiconductor chip and the circuit pattern of the main PCB.

According to an example embodiment, the semiconductor chip may be a BGA package.

According to an example embodiment, the semiconductor chip may include a plurality of first pads arranged in an array on a face of the semiconductor chip and the main PCB may include a plurality of second pads corresponding to the first pads, each of the first and second pads may be aligned through a corresponding hole in the auxiliary PCB.

According to an example embodiment, at least one conductive joint may connect one of the first pads to a corresponding one of the second pads through the corresponding hole in the auxiliary PCB.

According to an example embodiment, the auxiliary PCB may have a thickness less than or equal to a height of the conductive joints.

According to an example embodiment, the circuit pattern of the auxiliary PCB may extend to an edge portion of at least one of the holes formed in the auxiliary PCB, and the circuit pattern may be electrically connected to the conductive joint formed in the hole.

According to an example embodiment, the auxiliary PCB may include at least one input/output pad connected to an edge portion of at least one of the holes, the input/output pads may be electrically connected to the conductive joint formed in the hole.

According to an example embodiment, the circuit pattern in the auxiliary PCB may be connected to one of a test pad and a decoupling device.

According to an example embodiment, the auxiliary PCB may be a flexible single layer substrate.

According to an example embodiment, the auxiliary PCB may be a flexible multilayer structure including a plurality of substrates.

BRIEF DESCRIPTION OF THE DRAWINGS

Example embodiments will be described with reference to the accompanying drawings.

DESCRIPTION OF EXAMPLE EMBODIMENTS

Figure 1:
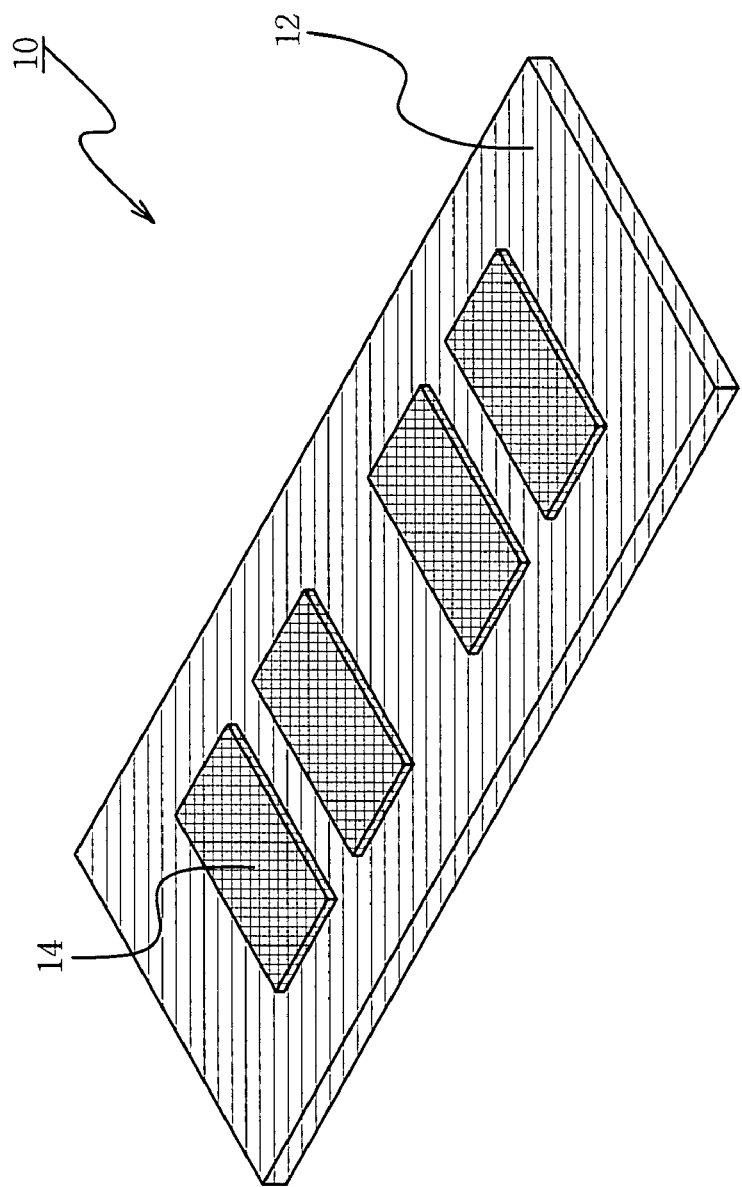
FIG. 1 illustrates a conventional integrated circuit module.
Figure 2:
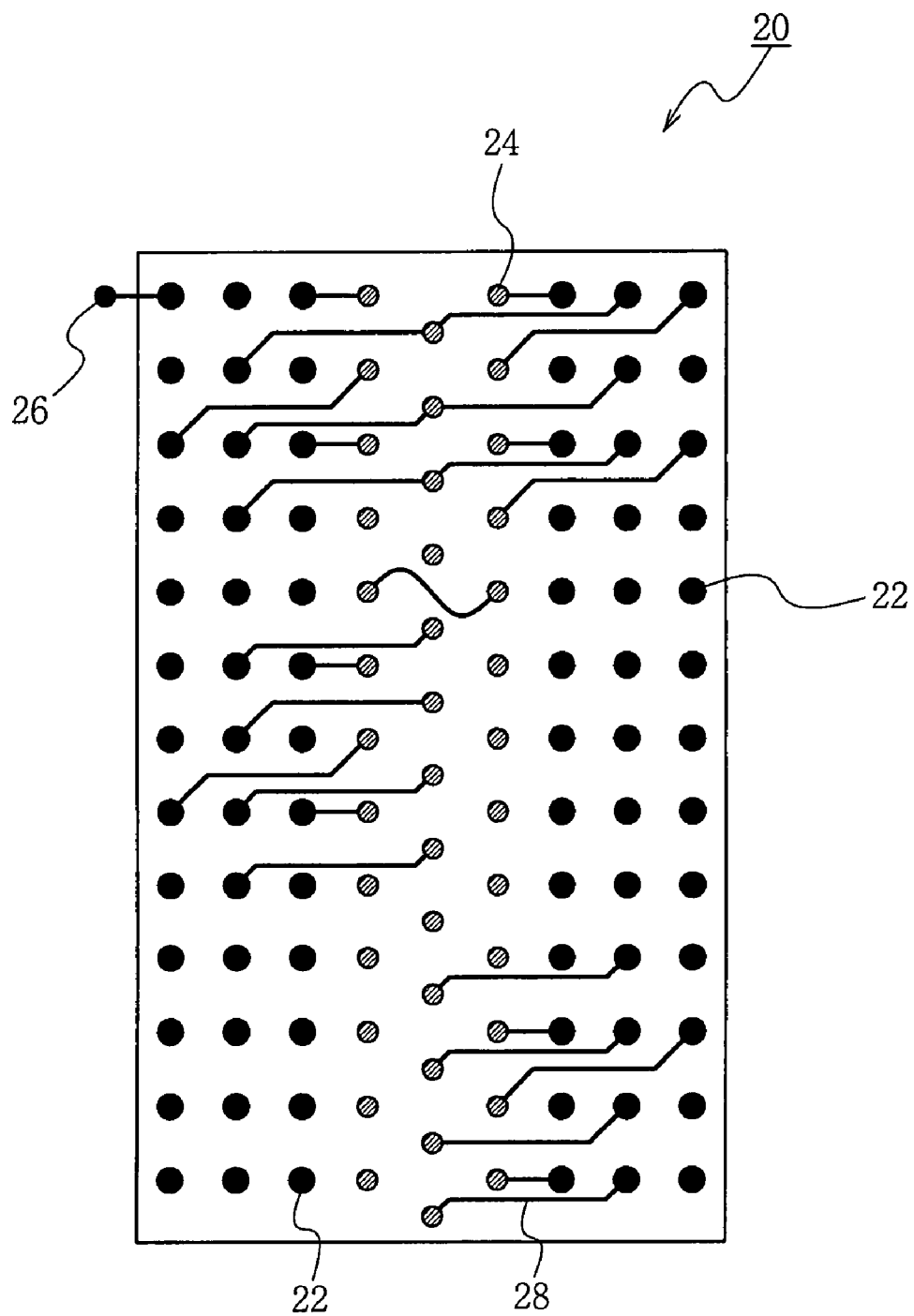
FIG. 2 is a plan view of a conventional PCB included in a conventional integrated circuit module.

Example embodiments will be described more fully hereinafter with reference to the accompanying figures. Example embodiments may, however, be embodied in many different forms and should not be construed as limited to the example embodiments set forth herein. Rather these example embodiments are provided so that this disclosure will be thorough, and will fully convey the scope to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope. Unless otherwise defined, all terms (including technical and scientific terms) used herein have the same meaning as commonly understood by one of ordinary skill in the art to which example embodiments belong. It will be further understood that terms used herein should be interpreted as having a meaning that is consistent with their meaning in the context of this specification and the relevant art and will not be interpreted in an idealized or overly formal sense unless expressly so defined herein.

Figure 3:
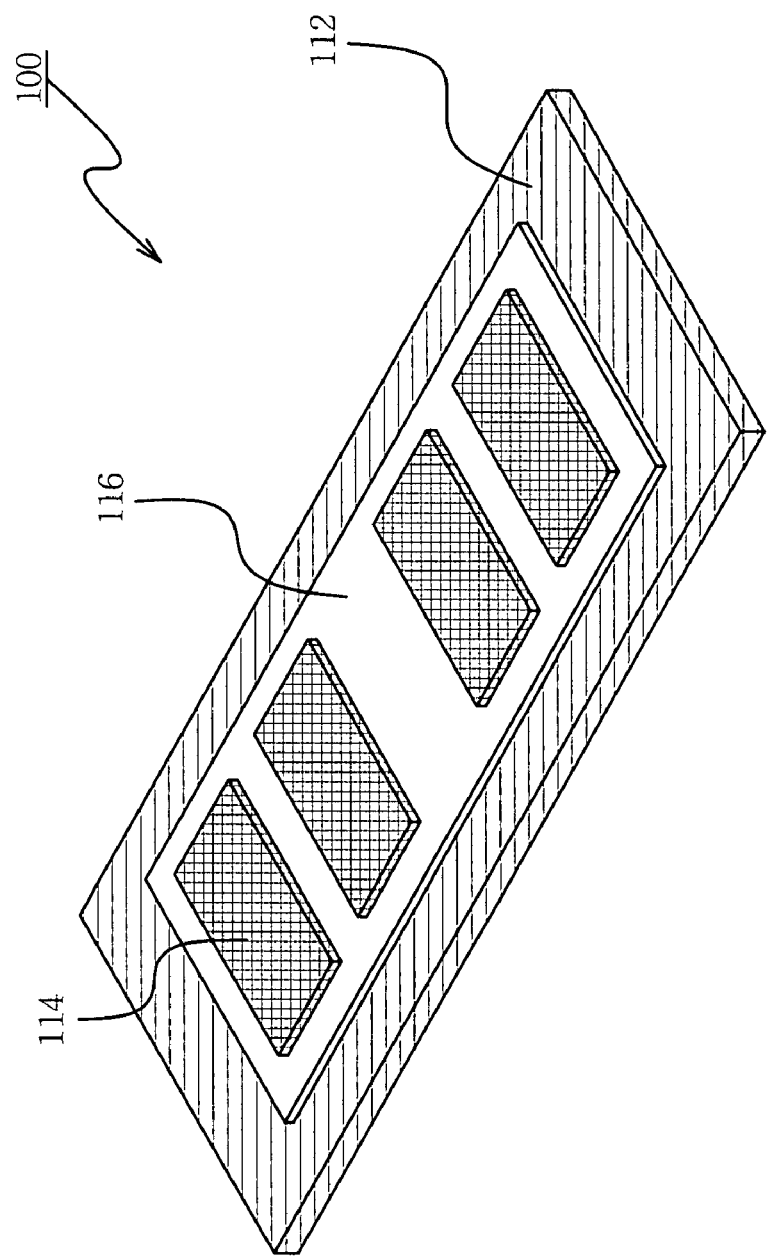
FIG. 3 illustrates an integrated circuit module according to an example embodiment.

FIG. 3 illustrates an integrated circuit module according to an example embodiment.

Referring to FIG. 3, an integrated circuit module 100 may include a main PCB 112, a semiconductor chip 114, and an auxiliary PCB 116.

The integrated circuit module 100 may have a structure different from a conventional integrated circuit module. For example, in mounting the semiconductor chip 114 on the main PCB 112, the auxiliary PCB 116 may be interposed between the semiconductor chip 114 and the main PCB 112.

The auxiliary PCB 116 may have a thickness smaller than or equal to a height of conductive bumps, for example, solder balls, which may connect the semiconductor chip 114 to the main PCB 112, and may be formed of flexible material. Holes may be formed in the auxiliary PCB 116 at positions corresponding to the positions of the conductive bumps, and through which the conductive bumps may pass. If a reflow process is performed on the conductive bumps formed through holes in the auxiliary PCB 116, the resulting conductive joint may electrically connect the semiconductor chip 114 to the main PCB 112.

Circuit patterns may be formed in the auxiliary PCB 116 that may be electrically connected to at least one circuit formed in the main PCB 112 and/or at least one circuit of the semiconductor chip 114.

Figure 4:
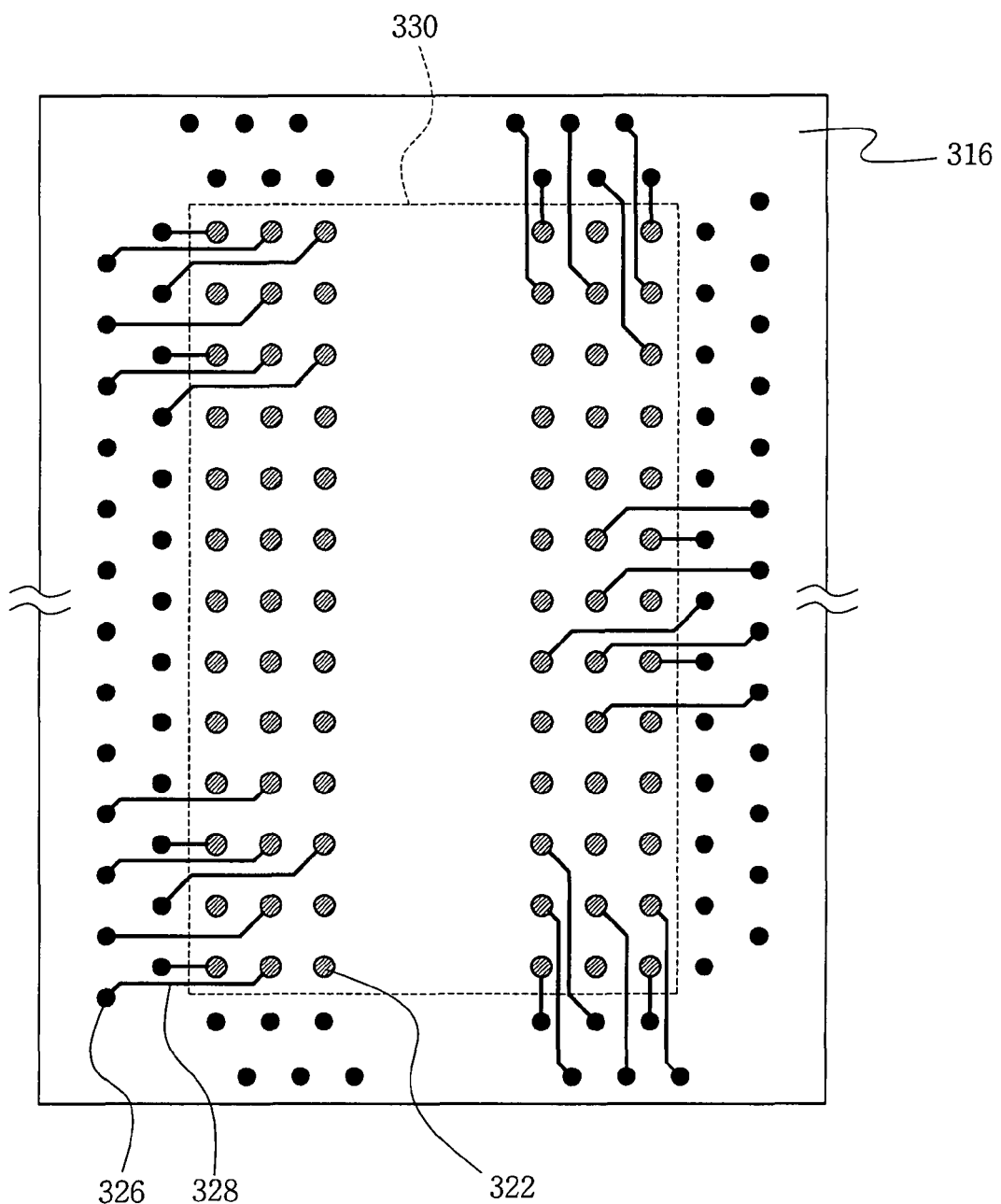
FIGS. 4 and 5 illustrate example embodiments of an auxiliary PCB.

FIG. 4 illustrates an auxiliary PCB 316 on which a test pad 326 connected to a signal line for a test is disposed, according to an example embodiment.

Referring to FIG. 4, the auxiliary PCB 316 may include a plurality of aligned holes 322, signal lines or circuit patterns 328, and/or test pads 326.

The auxiliary PCB 316 may have holes formed at positions corresponding to positions of the conductive bumps of the semiconductor chip 114. The conductive bumps may be attached to main PCB 112 through the holes 322. The number of holes 322 may correspond to the number of the conductive bumps, and the holes 322 may have a diameter equal to or larger than the height of the conductive bumps.

Test pads 326 may be disposed on a portion of the auxiliary PCB 316 outside of a semiconductor chip mounting region 330. The test pads 326 may be provided to test operation of the semiconductor chip 114 after the mounting of the semiconductor chip 114 or for measurement.

The test pads 326 may be electrically connected with signal lines or circuit patterns 328. The signal line or circuit pattern 328 may be extended to the holes 322. If the semiconductor chip 114 is mounted on the main PCB 112, the holes 322 may be filled with the conductive bumps. The conductive bumps may be electrically connected to the signal lines or circuit patterns 328 at the holes 322 (e.g., the reflow process causes the resulting joint to connect with the signal lines or circuit patterns), thus completing an electrical connection between the test pad 326 and the input/output pads of the semiconductor chip 114.

Figure 5:
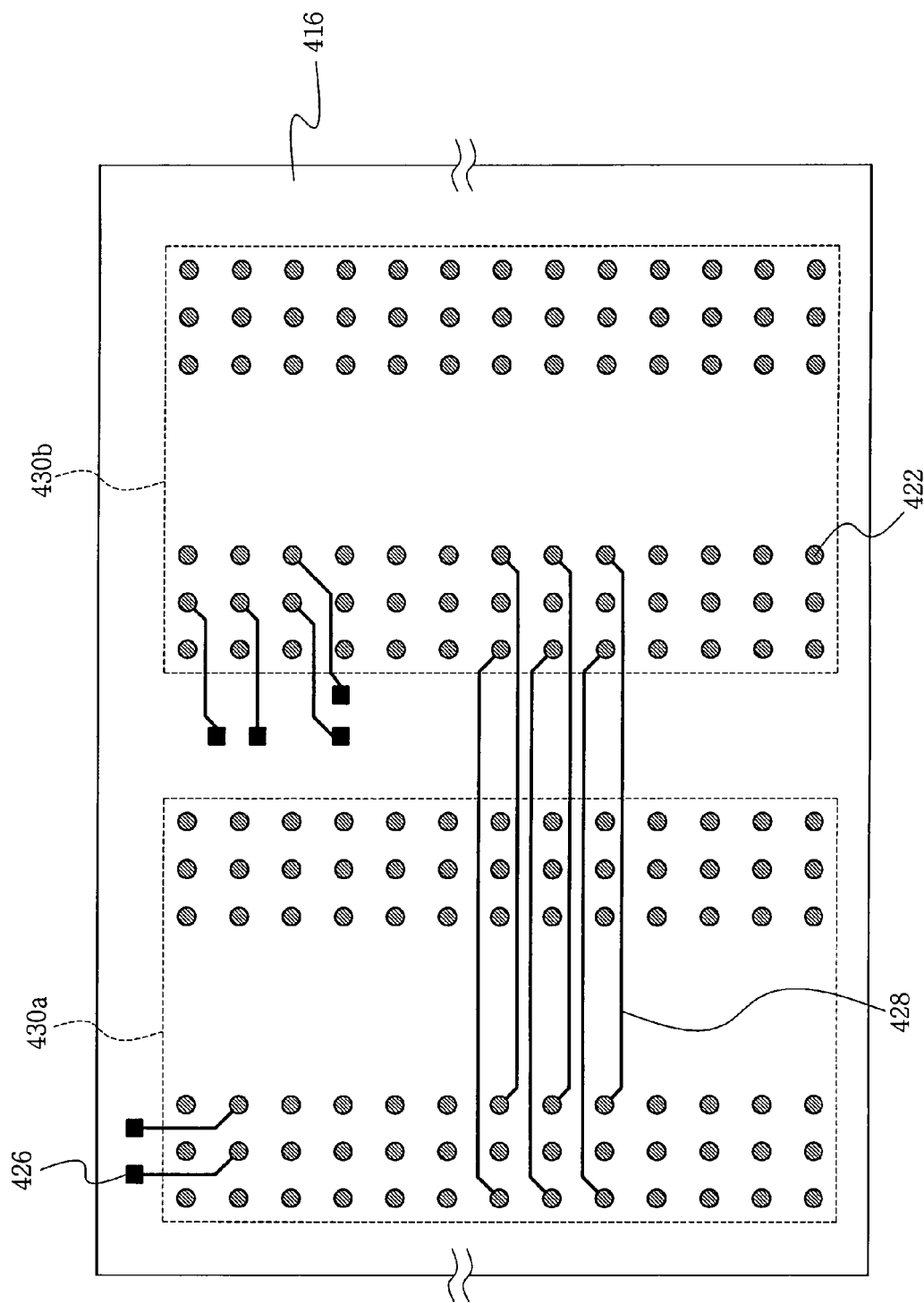

FIG. 5 illustrates an auxiliary PCB 416 equipped in mounting two semiconductor chips 112, according to an example embodiment.

Referring to FIG. 5, the auxiliary PCB 416 may have a plurality of holes 422 aligned in a first semiconductor chip mounting region 430a and a second semiconductor chip mounting region 430b. Decoupling devices 426 may be disposed on the auxiliary PCB 416 in a portion outside of the semiconductor chip mounting regions 430a and 430b.

The decoupling devices 426 may be used in the integrated circuit module to make the signal clearer, for example, the signal may be input or output without the influence of noise from the semiconductor chip. For example, the decoupling devices may be decoupling capacitors, resistors, etc.

According to conventional art, the decoupling devices may have been electrically connected with input/output pads of the semiconductor chip 114 through circuit pattern created in the main PCB 112. However, according to an example embodiment, decoupling devices 426 may be set on the auxiliary PCB 416, and may be electrically connected with input/output pads of the semiconductor chip 114.

The auxiliary PCB 416 may have holes 422 formed at positions corresponding to the positions of the conductive bumps of the semiconductor chip 114. The number of holes 422 may correspond to the number of the conductive bumps, and the holes 422 may have a diameter equal to or larger than the height of the conductive bumps.

Each of the decoupling devices 426 may be electrically coupled to a signal line or circuit pattern 428. The signal line or circuit pattern 428 may be extended to the holes 422. Signal lines or circuit patterns 428 may also be configured to electrically connect holes 422 formed in the first semiconductor chip mounting region 430a with holes 422 formed in the second semiconductor chip mounting region 430b. Namely, if input/output pads of the first and second semiconductor chips 114 need to be electrically connected with one another, holes 422 formed in the respective semiconductor chip mounting regions 430a and 430b may be connected by a signal line or circuit pattern 428.

If the semiconductor chips 114 are mounted on the main PCB 112, the conductive bumps may fill the holes 422. A reflow process may be performed on the conductive bumps to form conductive joints in the holes 422 that electrically couple the signal lines or circuit patterns 428 to input/output pads of the semiconductor chips 114.

According to any example embodiment, a thickness of an auxiliary PCB may be equal to or smaller than the height of the conductive bumps and/or the conductive joint formed by the reflow process. The auxiliary PCB may have a single layer substrate structure or a multilayer structure including a plurality of substrates. The auxiliary PCB may be formed of flexible substrate or substrate material the same as the existing PCB.

The auxiliary PCB is not limited to the example embodiments described above, but may be varied in numerous ways. For example, a circuit pattern, which may be difficult to be added to a main PCB, may be configured on an auxiliary PCB. Further, in manufacturing a plurality of integrated circuit modules, of which some may have an identical configuration and some may have a different configuration, the identical circuit patterns may be formed on a main PCB and the different circuit patterns may be formed on an auxiliary PCB.

As described above, an integrated circuit module including an auxiliary PCB, according to an example embodiment, may allow a circuit pattern formed on a PCB to be more simplified as compared with a conventional PCB, and if an additional circuit pattern or signal line needs to be added, it may be realized more easily; thus wiring efficiency may be increased. Further, a wiring interval of a circuit pattern may be widened, thus noise between wires may be reduced.

Figure 6:
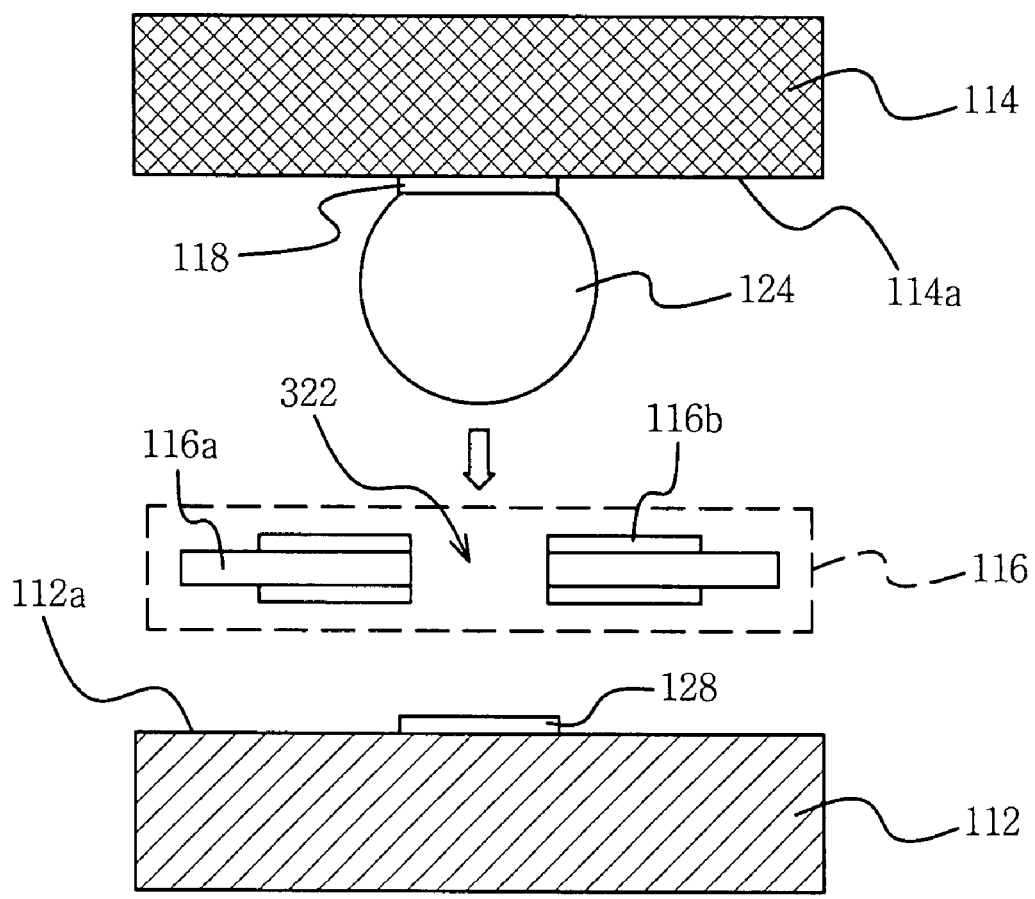
FIGS. 6 to 8 illustrate a method of forming an integrated circuit module according to an example embodiment.
Figure 7:
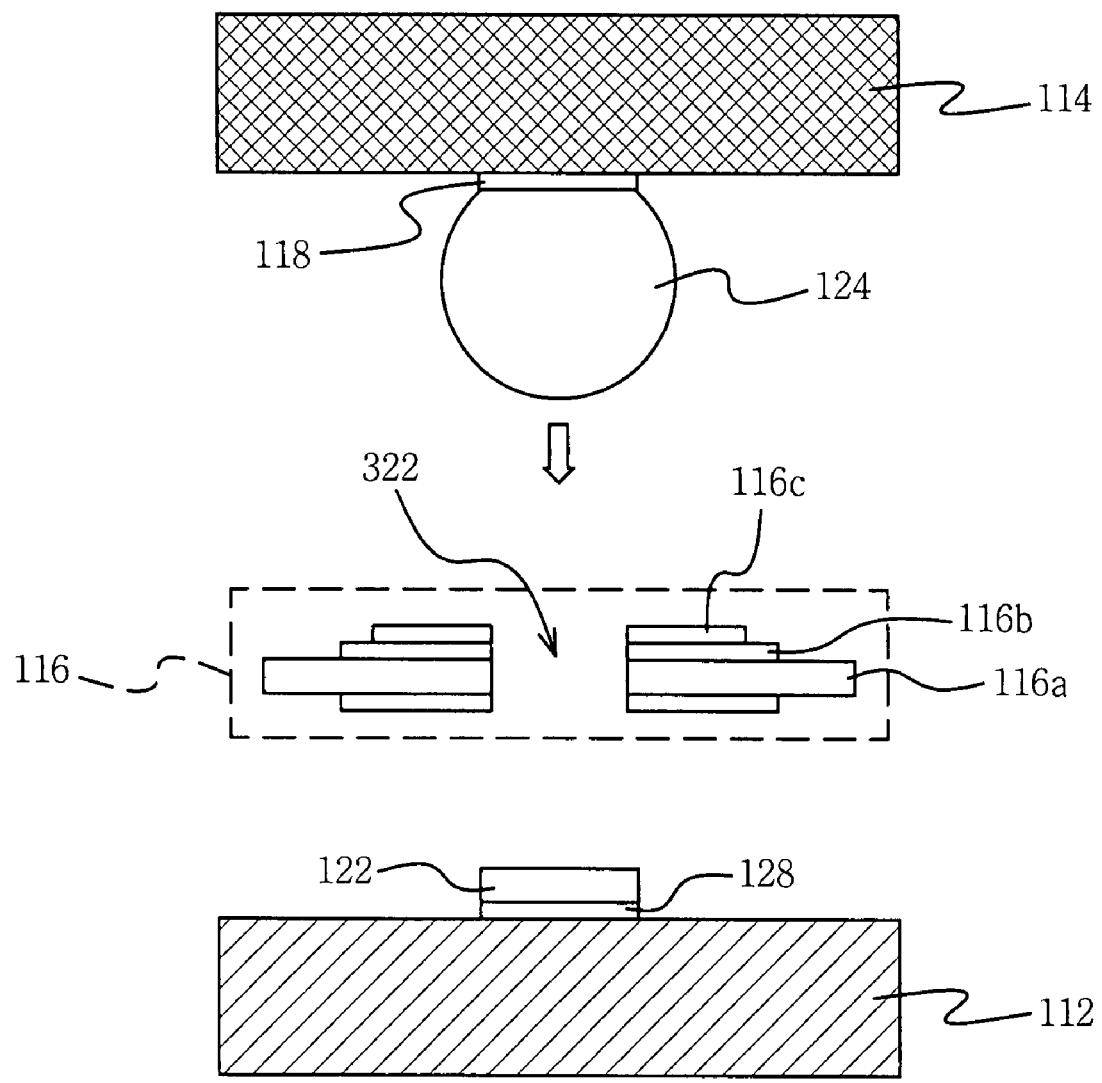
Figure 8:
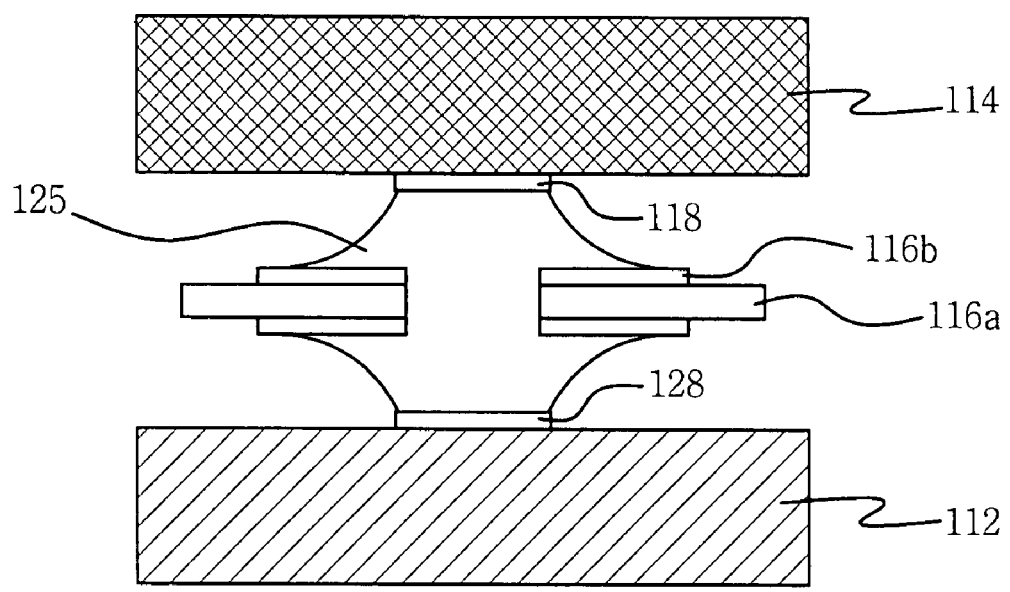

FIGS. 6 to 8 are sectional views illustrating a method of forming an integrated circuit module 100 according to an example embodiment.

Referring to FIG. 6, a semiconductor chip 114 may be provided having input/output pads (not shown) on a face 114a of the semiconductor chip 114. First solder pads 118 may be connected (not shown) to the input/output pads and may be arrayed at a constant interval on the face 114a of the semiconductor chip 114. A conductive bump 124, for example, a solder ball, may be attached to each of or selected ones of the first solder pads 118. The conductive bump 124 may be formed of a conductive material.

A main PCB 112 may be provided having a mounting region on which at least one semiconductor chip 114 may be disposed. The main PCB 112 may have a circuit pattern to connect to the semiconductor chip 114. If the decoupling device is to be disposed on an auxiliary PCB 116, the main PCB 112 may have a mounting region on which to mount the decoupling device and a circuit pattern to connect to the decoupling device. However, if a decoupling device is instead disposed on the auxiliary PCB 116, a mounting region for mounting the decoupling device on the main PCB 112 is unnecessary. The main PCB 112 may also have a circuit pattern for interfacing with another PCB and/or a circuit pattern for interfacing with another semiconductor chip.

Second solder pads 128 may be provided on a face 112a of the main PCB 112 at positions corresponding to the first solder pads 118. The conductive bumps 124 attached to the semiconductor chip 114 may be disposed on the second solder pads 128.

An auxiliary PCB 116 may be interposed and aligned between the semiconductor chip 114 and the main PCB 112. The holes 322 formed in the auxiliary PCB 116 may be aligned with a position corresponding to the position of the conductive bumps 124 and the second solder pads 128.

The auxiliary PCB 116 may include a substrate 116a formed of an insulation material. Circuit patterns may be routed on one face or both faces of the substrate 116a. Extended signal lines or input/output terminals 116b of circuit patterns may be formed on the substrate 116a and may be extended to the holes 322.

With the auxiliary PCB interposed between the semiconductor chip 114 and the main PCB 112, an existing reflow process is performed, thus mounting the semiconductor chip 114 on the main PCB 112. For example, the semiconductor chip 114 may be mounted on the main PCB 112 by heating the conductive bump 124 to a temperature over their melting point to form conductive joints 125 that fill the holes 322 in auxiliary PCB 116. The conductive joints 125 may connect the first solder pads 118 to the second solder pads 128.

Referring to FIG. 7, solder paste layer 116c and 122 may be formed on the input/output terminal 116b of the auxiliary PCB 116 and/or on the second solder pad 128 on which the conductive bump 124 may be disposed. The solder paste layer 116c and 122 may be formed of conductive material so that an adhesion between the conductive joint 125 and the second solder pad 128, and between the conductive joint 125 and the input/output terminal 116b of the auxiliary PCB 116, may be improved.

Referring to FIG. 8, the mounting method of FIG. 6 may provide an electrically conductive structure including the extended signal line or input/output terminal 116b formed in the auxiliary PCB 116, the conductive joint 125, the first solder pad 118 and the second solder pad 128. For example, the auxiliary PCB 116, the input/output terminal 116b of the auxiliary PCB 116, the first solder pad 118 coupled to an input/output pad (not shown) of the semiconductor chip, and the second solder pad 128 connected to an input/output terminal of circuit patterns created in the main PCB 112 may be electrically connected through the conductive joint 125.

While FIGS. 6 to 8 show only one conductive joint, it will be understood by one skilled in the art that a plurality of conductive joints may be used to form an integrated circuit module.

The fabrication process of the integrated circuit module may be simplified by using an existing BGA package mounting process and reflow process. In addition, the auxiliary PCB 116, the semiconductor chip 114, and the main PCB 112 may be electrically connected through the conductive joint 125, and plating may not be required to electrically connect with circuit patterns formed on the auxiliary PCB 116; thus enhancing reliability of the integrated circuit module.

Example embodiments may allow a more simplified circuit pattern to be formed on a PCB as compared with a circuit pattern formed on a conventional PCB. Additionally, a circuit pattern or signal line may be added without increasing a mounting area or mounting height, thus increasing wiring efficiency. Further the mounting area of a PCB may be reduced, thus increasing layout efficiency.

Example embodiments may reduce distortion of signal fidelity and degradation by lessening a difference between a signal actually input to a device and a measurement signal. Further, noise may be reduced between wires by widening a wiring interval of circuit patterns.

Example embodiments may simplify the fabrication process by using an existing BGA package mounting process and reflow process. Further, plating for an electrical connection with circuit patterns on an auxiliary PCB may be unnecessary, thus reliability may be increased.

It will be apparent to those skilled in the art that modifications and variations can be made without deviating from the spirit or scope of the example embodiments. Thus, it is intended that any such modifications and variations are covered within the scope of the invention.

What is claimed is:

1. A method of forming an integrated circuit module, comprising:
   interposing an auxiliary PCB including a plurality of holes between at least one semiconductor chip including a plurality of first pads and a main PCB including a plurality of second pads, the auxiliary PCB further including at least one circuit pattern for electrical connection to one of the semiconductor chip and at least one circuit pattern formed on the main PCB; and
   aligning the plurality of first pads of the semiconductor chip to the plurality of second pads of the main PCB through the plurality of holes of the auxiliary PCB.

2. The method of claim 1, wherein the semiconductor chip is a BGA (Ball Grid Array) package.

3. The method of claim 1, wherein the plurality of first pads are arranged in an array on a face of the semiconductor chip.

4. The method of claim 3, further comprising:
   forming a conductive bump on one of the first pads of the semiconductor chip;
   filling one of the holes of the auxiliary PCB with the conductive bump to electrically connect the conductive bump to one of the second pads of the main PCB; and
   performing a reflow process on the conductive bump to form a conductive joint electrically connecting the one of the first pads and the one of the second pads through the one of the holes filled by the conductive bump.

5. The method of claim 4, wherein the auxiliary PCB has a thickness less than or equal to a height of the conductive bump.

6. The method of claim 4, wherein the circuit pattern of the auxiliary PCB extends to an edge of one of the holes formed in the auxiliary PCB, and the performing the reflow process forms a conductive joint that electrically connects to the circuit pattern of the auxiliary PCB.

7. The method of claim 4, wherein the auxiliary PCB includes at least one input/output pad connected to an edge portion of at least one of the holes, and the performing the reflow process forms a conductive joint that electrically connects to the input/output pad.

8. The method of claim 1, wherein the circuit pattern of the auxiliary PCB is connected to one of a test pad and a decoupling device.

9. The method of claim 1, wherein the auxiliary PCB is a flexible single layer substrate.

10. The method of claim 1, wherein the auxiliary PCB is a multilayer structure including a plurality of flexible substrate layers.

11. An integrated circuit module, comprising:
    a main printed circuit board (PCB) including at least one mounting region and at least one circuit pattern;
    at least one semiconductor chip disposed on the mounting region; and
    an auxiliary PCB between the semiconductor chip and the main PCB, the auxiliary PCB including at least one circuit pattern electrically connected to at least one of the semiconductor chip and the circuit pattern of the main PCB,
    wherein the semiconductor chip includes a plurality of first pads arranged on a face of the semiconductor chip, and
    the main PCB includes a plurality of second pads corresponding to the first pads, each of the first and second pads being aligned through a corresponding hole in the auxiliary PCB.

12. The module of claim 11, wherein the semiconductor chip is a BGA package.

13. The module of claim 11, further comprising:
    at least one conductive joint connecting one of the first pads to a corresponding one of the second pads through the corresponding hole in the auxiliary PCB.

14. The module of claim 13, wherein the auxiliary PCB has a thickness less than or equal to a height of the conductive joints.

15. The module of claim 13, wherein the circuit pattern of the auxiliary PCB extends to an edge portion of at least one of the holes in the auxiliary PCB, the circuit pattern of the auxiliary PCB being electrically connected to the conductive joint.

16. The method of claim 13, wherein the auxiliary PCB includes at least one input/output pad connected to an edge portion of at least one of the holes, the input/output pad being electrically connected to the conductive joint.

17. The module of claim 11, wherein the circuit pattern of the auxiliary PCB is connected to one of a test pad and a decoupling device.

18. The module of claim 11, wherein the auxiliary PCB is a flexible single layer substrate.

19. The module of claim 11, wherein the auxiliary PCB is a flexible multilayer structure including a plurality of substrates.

* * * * *